(12) United States Patent
Haga et al.

(10) Patent No.: US 6,990,028 B2
(45) Date of Patent: Jan. 24, 2006

(54) SEMICONDUCTOR MEMORY WITH SENSE AMPLIFIER EQUALIZER HAVING TRANSISTORS WITH GATE OXIDE FILMS OF DIFFERENT THICKNESSES

(75) Inventors: Ryo Haga, Yokohama (JP); Takeshi Nagai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 155 days.

(21) Appl. No.: 10/622,694

(22) Filed: Jul. 21, 2003

(65) Prior Publication Data

US 2004/0233753 A1 Nov. 25, 2004

(30) Foreign Application Priority Data

May 23, 2003 (JP) ..................................... 2003-146490

(51) Int. Cl.
*G11C 7/00* (2006.01)

(52) U.S. Cl. .................. 365/205; 365/189.11; 365/203; 365/204

(58) Field of Classification Search ................. 365/205, 365/189.11, 203, 204
See application file for complete search history.

(56) References Cited

U.S. PATENT DOCUMENTS

| 5,555,210 | A | 9/1996 | Kato |
| 6,181,618 | B1 | 1/2001 | Inaba et al. |
| 6,205,068 | B1 * | 3/2001 | Yoon ........................... 365/203 |
| 6,285,613 | B1 | 9/2001 | Koya |
| 6,333,662 | B1 * | 12/2001 | Umezawa et al. ........... 327/333 |
| 6,556,507 | B2 * | 4/2003 | Toda et al. .................. 365/233 |
| 6,602,751 | B2 * | 8/2003 | Oohashi ..................... 438/275 |

FOREIGN PATENT DOCUMENTS

| JP | 5-291535 | 11/1993 |
| JP | 2000-215676 | 8/2000 |

* cited by examiner

*Primary Examiner*—Connie C. Yoha
(74) *Attorney, Agent, or Firm*—Oblon, Spivak, McClelland, Maier & Neustadt, P.C.

(57) ABSTRACT

A sense amplifier is connected to a pair of bit lines to read/write data. A bit line equalizer equalizes the potentials of the pair of bit lines. A sense amplifier equalizer equalizes the potentials of two power supply nodes of the sense amplifier. The sense amplifier equalizer is constituted by two types of MOS transistors whose gate oxide films have different thicknesses. MOS transistors of one type are formed in a thick film type Tr area. MOS transistors of the other type are formed in a thick film type Tr area.

15 Claims, 12 Drawing Sheets

SEMICONDUCTOR MEMORY WITH SENSE AMPLIFIER EQUALIZER HAVING TRANSISTORS WITH GATE OXIDE FILMS OF DIFFERENT THICKNESSES

CROSS-REFERENCE TO RELATED APPLICATIONS

This application is based upon and claims the benefit of priority from the prior Japanese Patent Application No. 2003-146490, filed May 23, 2003, the entire contents of which are incorporated herein by reference.

BACKGROUND OF THE INVENTION

1. Field of the Invention

The present invention relates to a low voltage driven type sense amplifier and, more particularly, to a dynamic RAM (to be referred to as a DRAM hereinafter).

2. Description of the Related Art

FIG. 1 shows the schematic layout of the memory cell array portion of a general DRAM. FIG. 2 shows a circuit example of the memory cell array portion.

A memory cell array 11 is constituted by a plurality of memory cells arranged in a matrix. A plurality of word lines WL that run in the row direction and a plurality of bit lines BL that run in the column direction are arranged on the memory cell array 11. The plurality of bit lines BL normally form bit line pairs each of which includes two bit lines BLt and BLc, as shown in FIG. 2.

Sense amplifiers S/A are connected to the pairs of bit lines BLt and BLc to read/write data from/in the memory cell array 11. In this example, each sense amplifier S/A is constituted by two inverter circuits P1, N1, P2, and N2 which are flip-flop-connected. A P channel MOS transistor P3 is connected to a power supply node PN1 of the sense amplifier S/A to supply, e.g., a potential VBLH to the power supply node PN1. An N channel MOS transistor N3 is connected to a power supply node PN2 of the sense amplifier S/A to supply, e.g., a ground potential VSS to the power supply node PN2.

The sense amplifier S/A is controlled by control signals SEP and SEN. The sense amplifier S/A is activated when the control signal SEP is "L" and the control signal SEN is "H".

A sense amplifier equalizer SAE has a function of equalizing the potentials of the two power supply nodes PN1 and PN2 of the sense amplifier S/A. The sense amplifier equalizer SAE is constituted by N channel MOS transistors N4, N5, and N6. The N channel MOS transistor N4 has a function of short-circuiting the two power supply nodes PN1 and PN2. The N channel MOS transistors N5 and N6 have a function of supplying a precharge potential VBL to the two power supply nodes PN1 and PN2.

The sense amplifier equalizer SAE is controlled by a control signal SAEQL. When the control signal SAEQL is "H", the sense amplifier equalizer SAE equalizes the two power supply nodes PN1 and PN2 to the precharge potential VBL.

A bit line equalizer BLE has a function of equalizing the potentials of the pair of bit lines BLt and BLc. The bit line equalizer BLE is constituted by N channel MOS transistors N7, N8, and N9. The N channel MOS transistor N7 has a function of short-circuiting the pair of bit lines BLt and BLc. The N channel MOS transistors N8 and N9 have a function of supplying the precharge potential VBL to the pair of bit lines BLt and BLc.

The bit line equalizer BLE is controlled by a control signal EQL. When the control signal EQL is "H", the bit line equalizer BLE equalizes the pair of bit lines BLt and BLc to the precharge potential VBL.

Note that the arrangement of the memory cell array portion is described in, e.g., patent references 1 to 4.

The operation of the memory cell array portion shown in FIG. 2 in read operation will be described next with reference to the waveform chart shown in FIG. 3.

First, when the control signals EQL and SAEQL change to "H", the pair of bit lines BLt and BLc and the power supply nodes PN1 and PN2 of the sense amplifier S/A are equalized to the precharge potential VBL.

Then, when the control signals EQL and SAEQL change to "L", equalization of the pair of bit lines BLt and BLc and the power supply nodes PN1 and PN2 of the sense amplifier S/A is canceled. The pair of bit lines BLt and BLc and the power supply nodes PN1 and PN2 of the sense amplifier S/A are set at the precharge potential VBL and in a floating state.

When the potential of the selected word line WL rises, a potential difference corresponding to the data of the memory cell connected to the selected word line WL is generated between the pair of bit lines BLt and BLc. When a sufficient potential difference is generated between the pair of bit lines BLt and BLc, the sense amplifier S/A is activated.

More specifically, when the control signal SEP is set to "L" and the control signal SEN is set to "H", the power supply node PN1 (SAP) changes to "H" and the power supply node PN2 (bSAN) changes to "L", so the sense amplifier S/A is activated. As a result, the potential difference between the pair of bit lines BLt and BLc is amplified.

After that, the potential of the selected word line WL is dropped to stop the access to the memory cell. In addition, the control signal SEP is set to "H", and the control signal SEN is set to "L" to inactivate the sense amplifier S/A. Furthermore, the control signals EQL and SAEQL are set to "H" to equalize the pair of bit lines BLt and BLc and the power supply nodes PN1 and PN2 of the sense amplifier S/A.

Patent references relating to the related art will be showed below.

Patent reference 1: Jpn. Pat. Appln. KOKAI Publication No. 5-291535

Patent reference 2: Jpn. Pat. Appln. KOKAI Publication No. 2000-215676

Patent reference 3: U.S. Pat. No. 6,181,618

Patent reference 4: U.S. Pat. No. 6,285,613

As shown in FIG. 2, both the bit line equalizer BLE and the sense amplifier equalizer SAE are constituted by only N channel MOS transistors. In this case, the equalizing operation may delay depending on the threshold voltage of the MOS transistors. To prevent this, a power supply voltage VCC that is higher than the "H"-level voltage, i.e., the potential VBLH to be applied to the pair of bit lines BLt and BLc is normally used as the "H"-level voltage of the control signals EQL and SAEQL that control the equalizers BLE and SAE.

Additionally, as shown in FIGS. 1 and 2, the bit line equalizer BLE is normally arranged adjacent to the sense amplifier S/A. One bit line equalizer BLE is arranged in correspondence with each sense amplifier S/A (each pair of bit lines BLt and BLc). However, only one sense amplifier equalizer SAE is arranged in correspondence with a plurality of sense amplifiers S/A. For this reason, the sense amplifier equalizers SAE are arranged in dedicated areas prepared every plurality of sense amplifiers S/A.

FIG. 4 shows a layout example of the sense amplifier S/A and equalizers BLE and SAE in a chip.

As described above, the power supply voltage VCC applied to the equalizers BLE and SAE is higher than the voltage VBLH applied to the sense amplifier S/A. For this reason, the gate oxide film of each MOS transistor that constitutes the equalizers BLE and SAE must have a thickness sufficient to withstand the voltage VCC. On the other hand, since the voltage VBLH is applied to the sense amplifier S/A, the gate oxide film of each MOS transistor that constitutes the sense amplifier S/A only needs to be thick enough to withstand the voltage VBLH.

Conventionally, however, the gate oxide films of all MOS transistors that constitute the sense amplifier S/A, bit line equalizer BLE, and sense amplifier equalizer SAE are formed to be thick enough to withstand the power supply voltage VCC because, for example, the potential difference between the voltages VCC and VBLH is small. Even when the gate oxide film of each MOS transistor that constitutes the sense amplifier S/A is thick, no particular problem is posed because a sufficient driving force can be ensured for the sense amplifier S/A.

Along with the recent reduction in size and power consumption of LSIs, the power supply voltage VCC is becoming low. In a DRAM, a voltage applied to a word line has a close relation to memory cell operation and therefore cannot be decreased. That is, in a DRAM, the power supply voltage VCC serving as a source for generating the voltage to be applied to a word line cannot be decreased. Consequently, in the memory cell array portion of a DRAM, only the value of the voltage VBLH applied to the pair of bit lines BLt and BLc becomes small.

This leads to an increase in potential difference between the voltages VBLH and VCC. If the sense amplifier S/A is constituted by only VCC type MOS transistors with thick gate oxide films, the driving force of the sense amplifier S/A poses a problem.

To solve this problem, MOS transistors each having a thin gate oxide film corresponding to the voltage VBLH are used for the sense amplifier S/A, and MOS transistors each having a thick gate oxide film corresponding to the power supply voltage VCC are used for the equalizers BLE and SAE.

FIG. 5 shows a layout example of the sense amplifier S/A and bit line equalizer BLE, which are connected to a pair of bit lines.

A thick film type Tr area is an area constituted by VCC type MOS transistors, each of which has a gate oxide film that is thick enough to withstand the power supply voltage VCC. A thin film type Tr area is an area constituted by VBLH type MOS transistors each of which has a gate oxide film that is thick enough to withstand the voltage VBLH (<VCC). The gate oxide film of a VBLH type MOS transistor is thinner than that of a VCC type MOS transistor.

The bit line equalizer BLE is formed in the thick film type Tr area. To the contrary, the sense amplifier S/A is formed in the thin film type Tr area to ensure a sufficient driving force even when the voltage VBLH of "H" level is applied to the pair of bit lines BLt and BLc.

As described above, when a plurality of MOS transistors whose gate oxide films have different thicknesses are laid out in the memory cell array portion, an isolation area must be prepared between the MOS transistors having gate oxide films with different thicknesses, i.e., between the thick film type Tr area and the thin film type Tr area, to safely form the MOS transistors. When all the MOS transistors in the memory cell array portion have gate oxide films of the same thickness, the isolation area is unnecessary.

FIG. 6 shows a layout example of the sense amplifier equalizer SAE.

The sense amplifier equalizer SAE is formed in a thick film type Tr area A. At this time, a thin film type Tr area B where the sense amplifier S/A is arranged is adjacent to the thick film type Tr area A where the sense amplifier equalizer SAE is arranged. Hence, an isolation area must be formed between these areas to safely form the plurality of MOS transistors having gate oxide films with different thicknesses.

That is, conventionally, to separate the bit line equalizer BLE from the sense amplifier S/A, an isolation area having a predetermined width in the column direction is necessary. In addition, to separate the sense amplifier equalizer SAE from the sense amplifier S/A, an isolation area having a predetermined width in the row direction is necessary.

As described above, depending on the decrease in "H"-level voltage (VBLH) of the pair of bit lines BLt and BLc, when the sense amplifier S/A is constituted by VBL type MOS transistors, the isolation areas in the memory cell array portion become large, and the layout size of the memory cell array portion increases.

To suppress an increase in layout size of the memory cell array portion, for example, the sense amplifier equalizer SAE is constituted by only VBLH type MOS transistors, as shown in FIG. 7.

In this case, since all transistors that constitute the sense amplifier equalizer SAE can be laid out in the thin film type Tr area B, the isolation area in the row direction as shown in FIG. 6 is unnecessary. In this scheme, however, since the size of each transistor that constitutes the sense amplifier equalizer SAE becomes small, the time required for equalization becomes long.

Hence, a semiconductor memory is demanded, which can prevent any increase in layout size of a memory cell array portion and also suppress any decrease in driving force of a sense amplifier equalizer even when the gate oxide film of each transistor that constitutes a sense amplifier has a thickness different from that of the gate oxide film of each transistor that constitutes a bit line equalizer.

BRIEF SUMMARY OF THE INVENTION

A semiconductor memory according to an aspect of the present invention comprises a memory cell array having a memory cell, a sense amplifier to read/write data from/into the memory cell array, a pair of bit lines to connect the memory cell to the sense amplifier, a bit line equalizer to equalize potentials of the pair of bit lines, and a sense amplifier equalizer to equalize potentials of two power supply nodes of the sense amplifier, wherein the sense amplifier equalizer comprises MOS transistors whose gate oxide films have different thicknesses.

DETAILED DESCRIPTION OF THE INVENTION

A semiconductor memory according to an embodiment of the present invention will be described below in detail with reference to the accompanying drawing.

1. Outline

In, e.g., a recent DRAM, the gate oxide film of a MOS transistor that constitutes a sense amplifier becomes thinner than that of a MOS transistor that constitutes a bit line equalizer as the operation voltage of LSIs decreases. In this case, if a sense amplifier equalizer is constituted by only MOS transistors having gate oxide films with the same thickness, an increase in layout size of the memory cell array portion or a decrease in equalization speed occurs due to the restriction on the design rule.

More specifically, when the sense amplifier equalizer is formed in a thick film type Tr area together with the bit line equalizer, the isolation area becomes large to increase the layout size of the memory cell array portion. On the other hand, when the sense amplifier equalizer is formed in a thin film type Tr area together with a sense amplifier, and the isolation area in the row direction is omitted, the area where the sense amplifier equalizer is to be formed becomes small. This reduces the transistor size and consequently decreases the equalization speed.

In the present embodiments described below, the sense amplifier equalizer is formed using a plurality of MOS transistors whose gate oxide films have different thicknesses and, more specifically, MOS transistors formed in the thick film type Tr area and MOS transistors formed in the thin film type Tr area. With this structure, both the problem of the increase in layout size of the memory cell array portion and the problem of the decrease in equalization speed for the sense amplifier are simultaneously solved.

2. First Embodiment

A semiconductor memory according to the first embodiment of the present invention will be described first.

Figure 1:
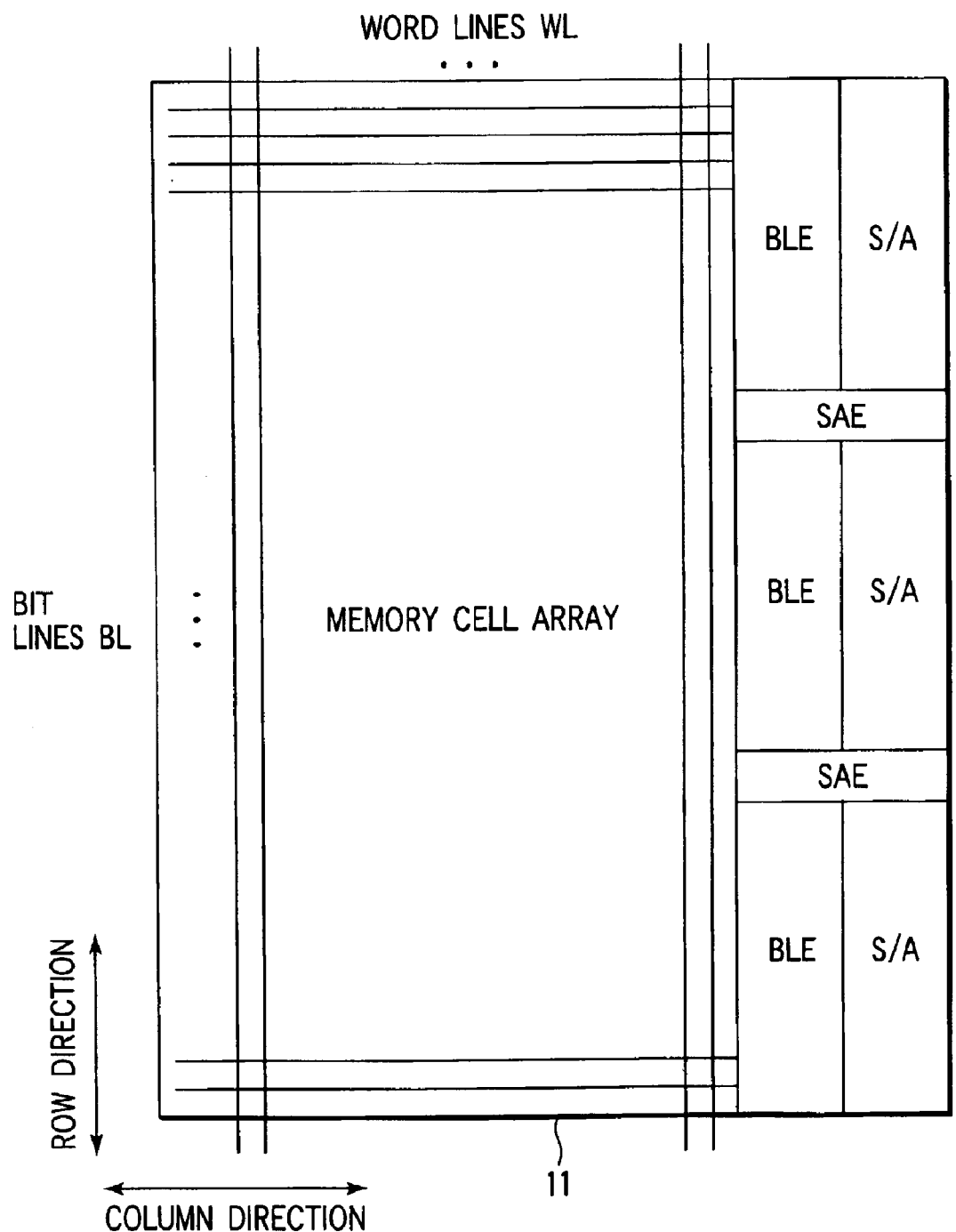
FIG. 1 is a view showing the schematic layout of a conventional memory cell array portion.
Figure 2:
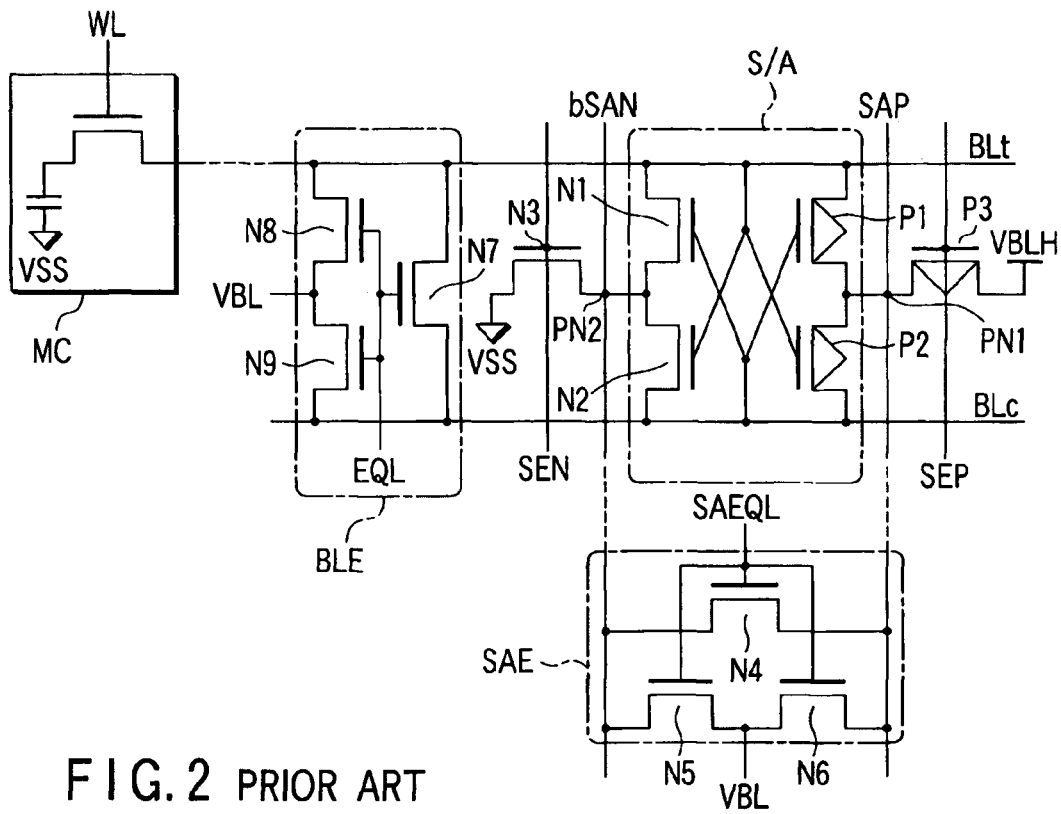
FIG. 2 is a view showing the equivalent circuit of the portion shown in FIG. 1.
Figure 3:
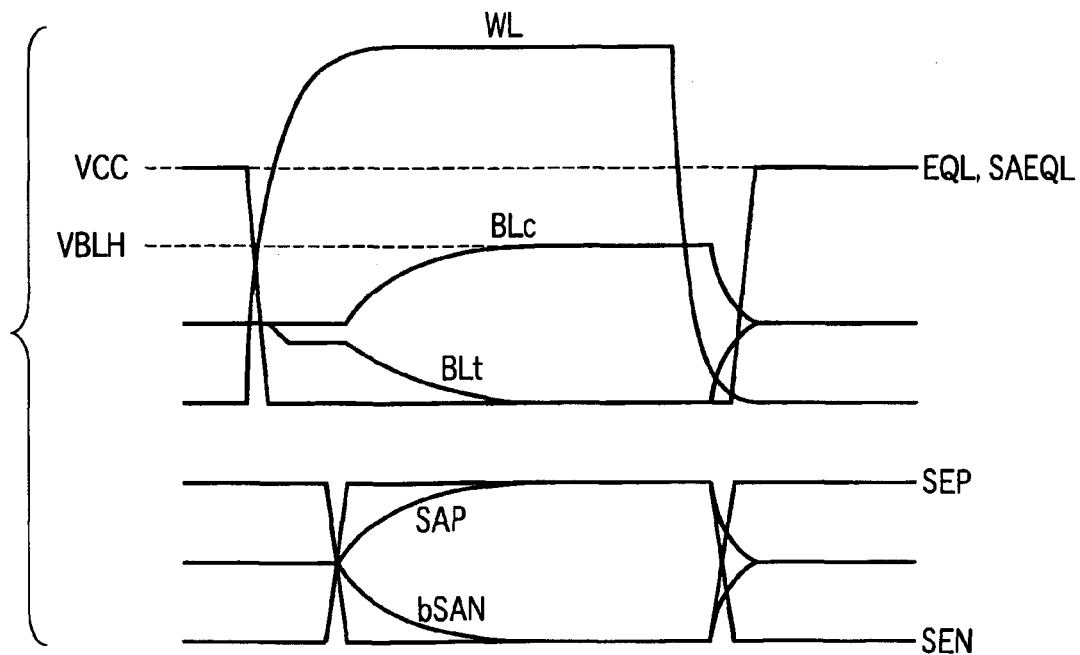
FIG. 3 is a waveform chart showing the operation of the conventional memory cell array portion.
Figure 4:
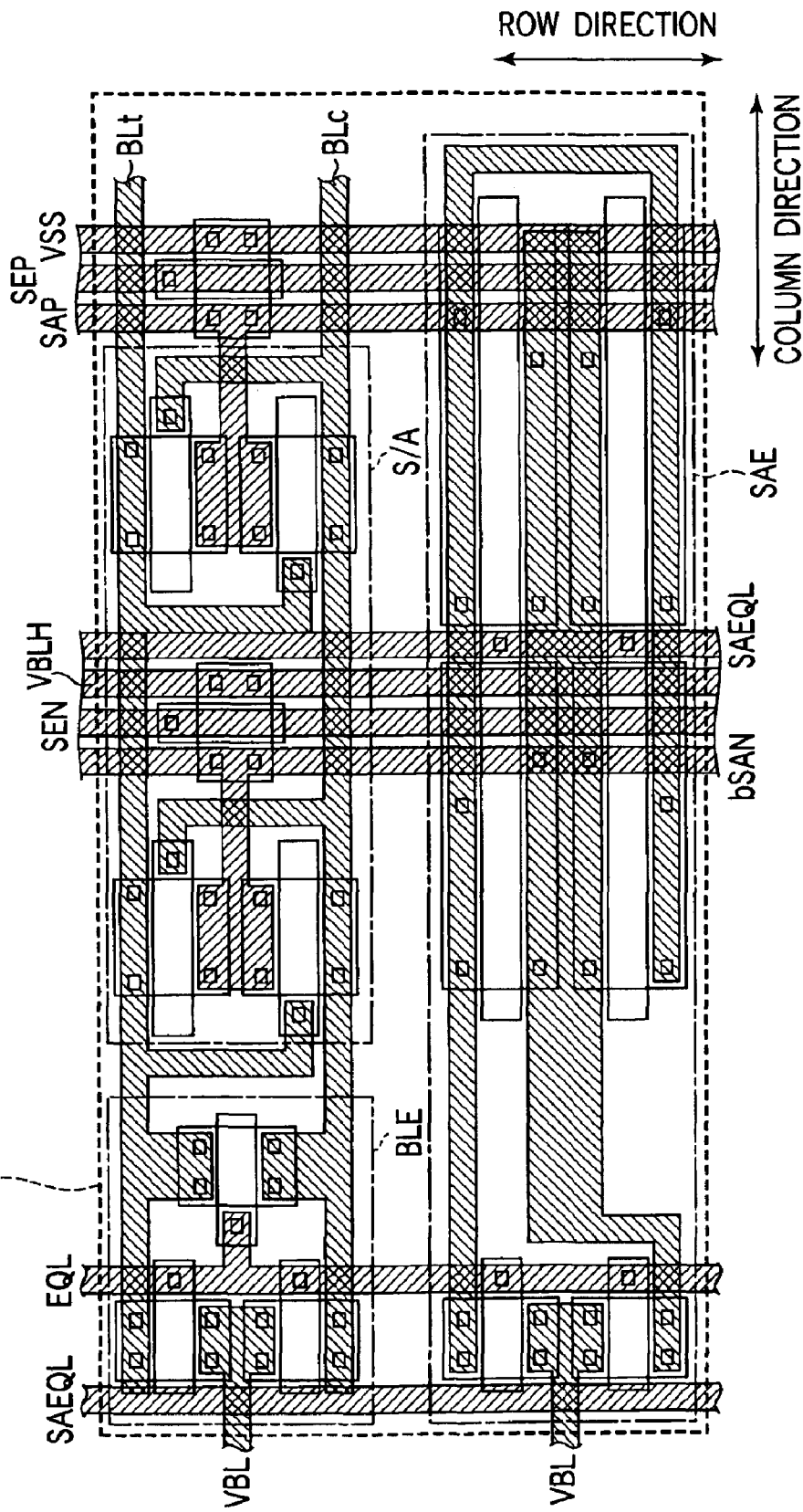
FIG. 4 is a view showing the schematic layout of the conventional memory cell array portion.
Figure 5:
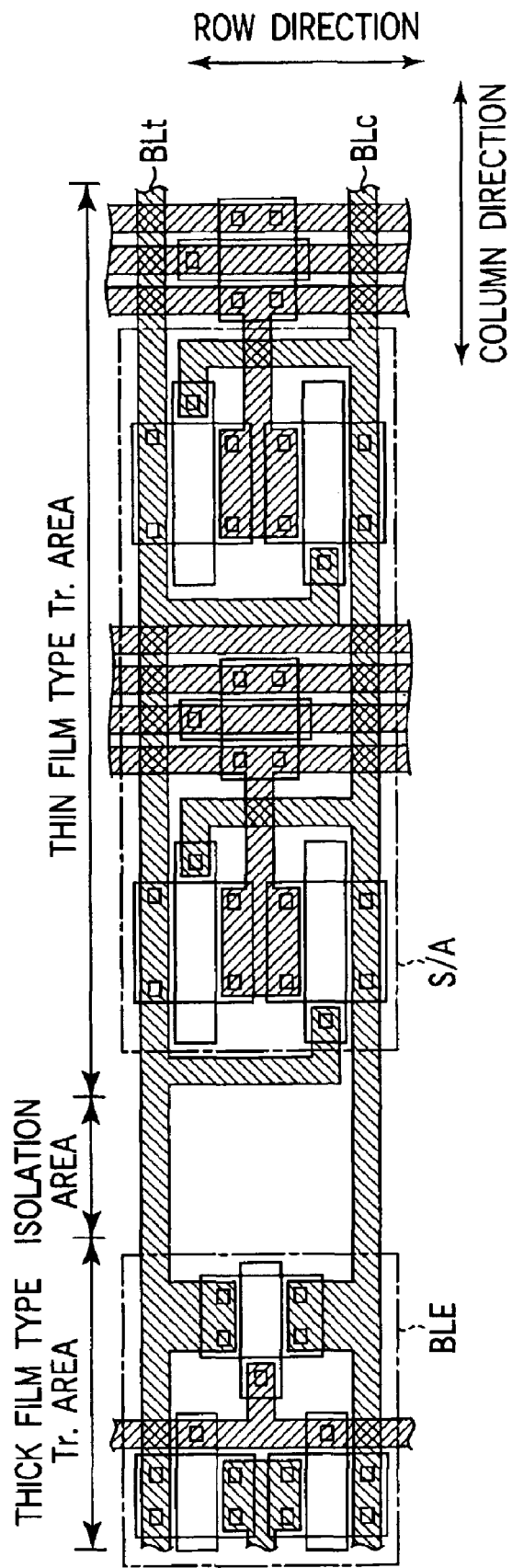
FIG. 5 is a view showing the schematic layout of the conventional memory cell array portion.
Figure 6:
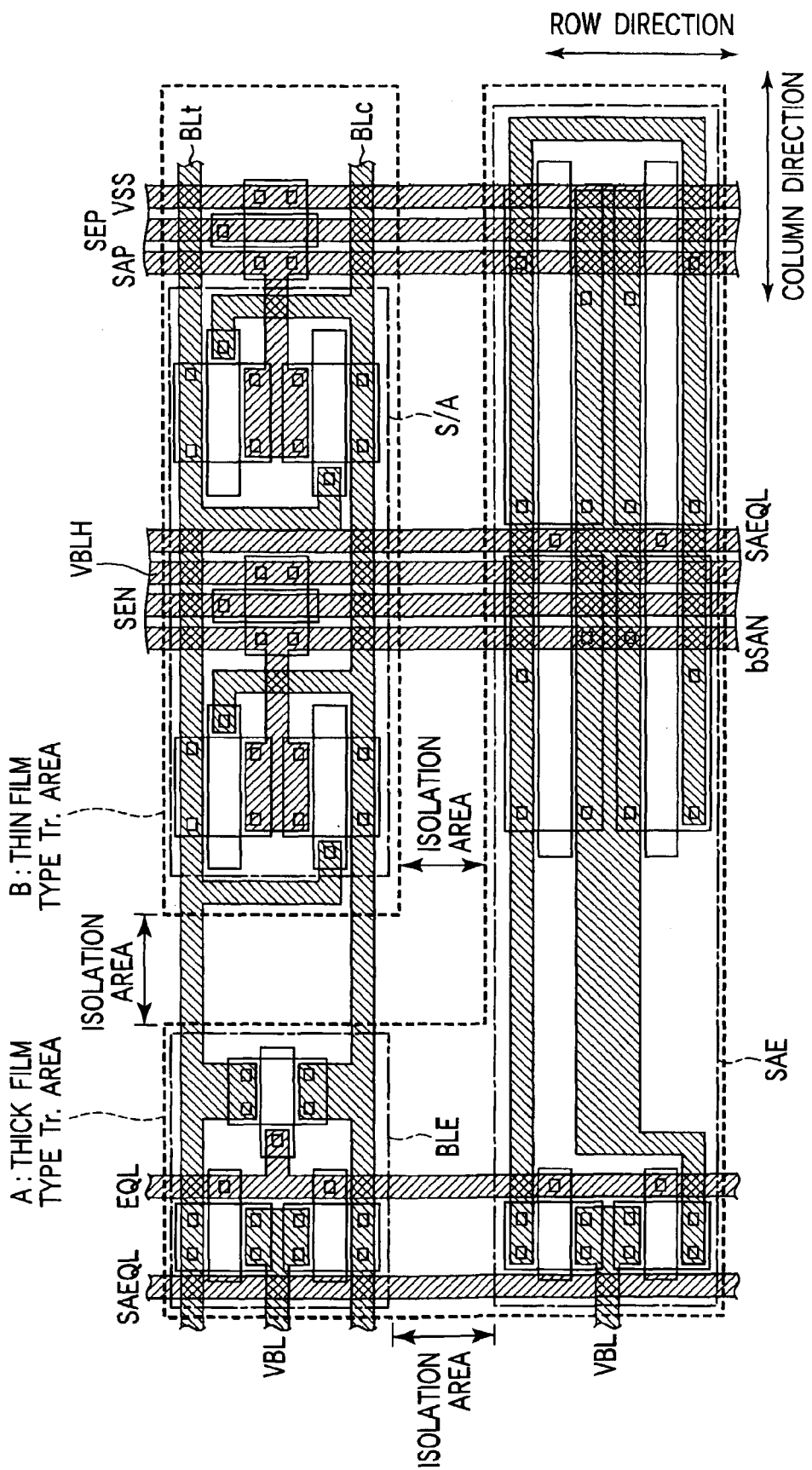
FIG. 6 is a view showing the schematic layout of the conventional memory cell array portion.
Figure 7:
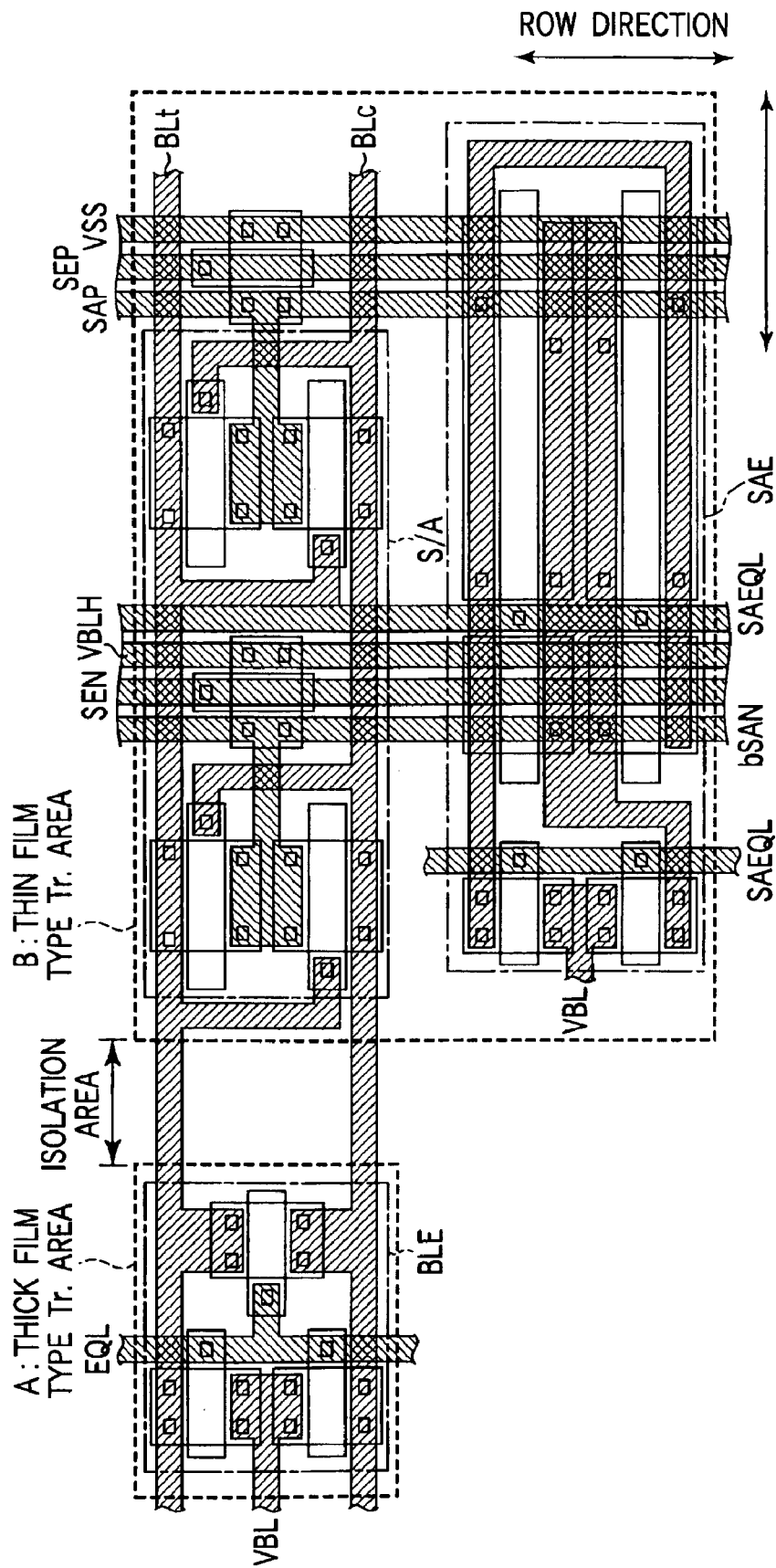
FIG. 7 is a view showing the schematic layout of the conventional memory cell array portion.
Figure 8:
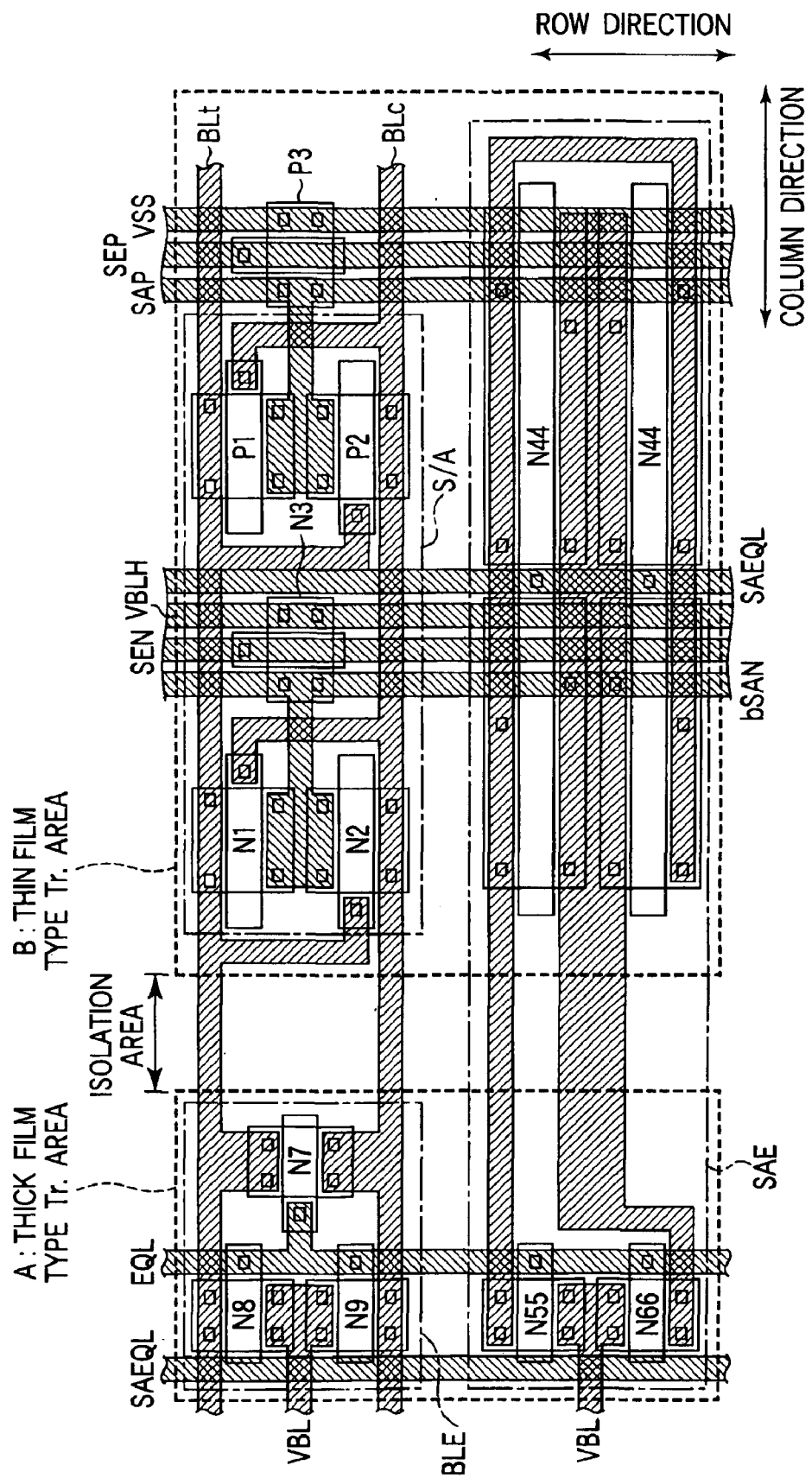
FIG. 8 is a view showing the layout of a memory cell array portion according to the first embodiment.
Figure 9:
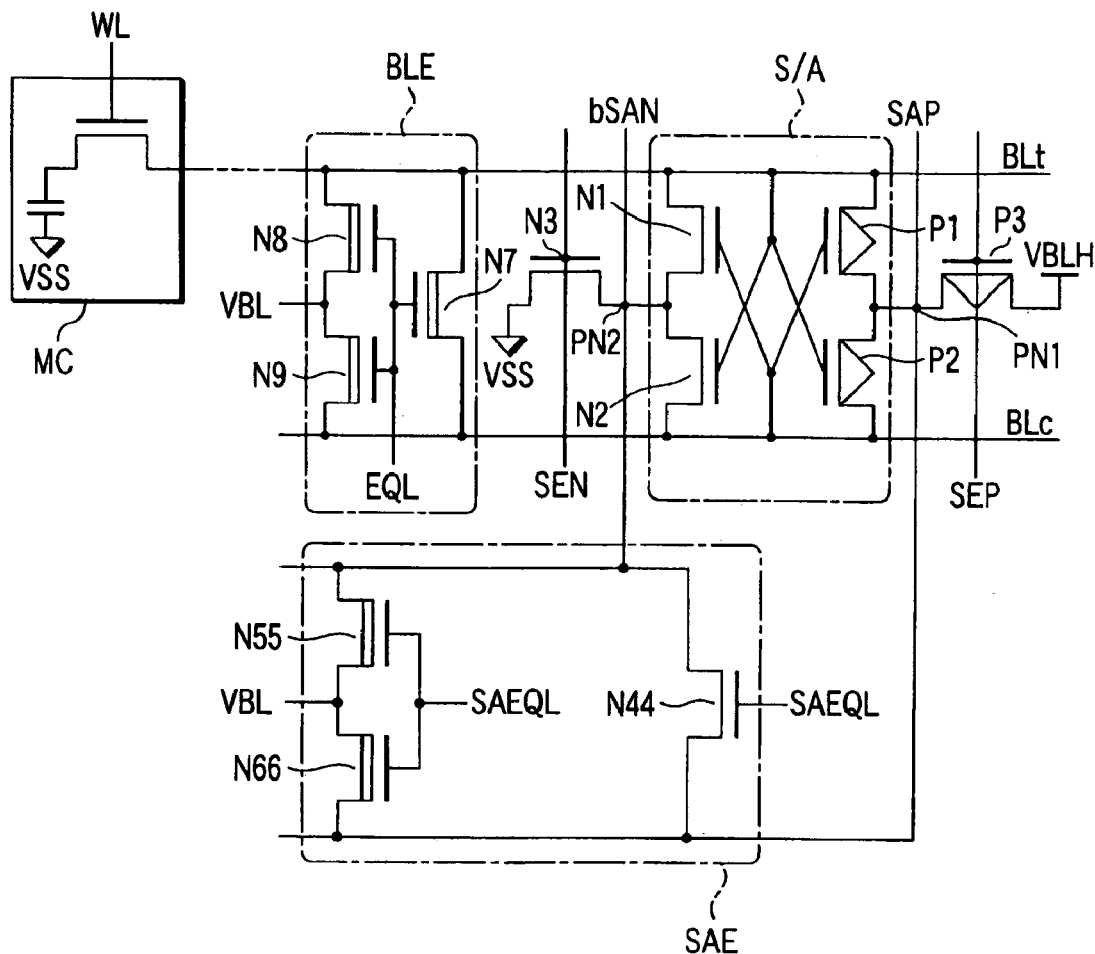
FIG. 9 is a view showing the equivalent circuit of the portion shown in FIG. 8.
Figure 10:
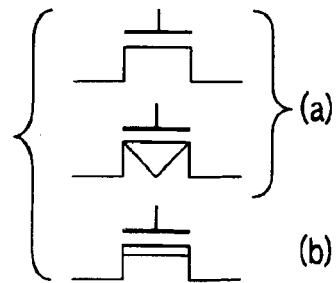
FIG. 10 is a view showing the meanings of symbols shown in FIG. 9.

FIG. 8 shows the layout of the memory cell array portion of a semiconductor memory according to the first embodiment of the present invention. FIG. 9 shows the equivalent circuit of the portion shown in FIG. 8. FIG. 10 shows the meanings of symbols shown in FIG. 9.

As a characteristic feature of this embodiment, a sense amplifier equalizer SAE is constituted by two types of MOS transistors whose gate oxide films have different thicknesses and, more specifically, VCC type MOS transistors formed in a thick film type Tr area A and VBLH type MOS transistors formed in a thin film type Tr area B.

This structure corresponds to a structure in which a bit line equalizer BLE is constituted by VCC type MOS transistors formed in the thick film type Tr area A, and a sense amplifier S/A is constituted by VBLH type MOS transistors formed in the thin film type Tr area B.

With this structure, the problem of the increase in layout size of the memory cell array portion and the problem of the decrease in equalization speed for the sense amplifier are simultaneously solved.

The layout of the memory cell array portion will be described below in detail with reference to FIGS. 8 to 10.

The sense amplifier S/A is connected to pairs of bit lines BLt and BLc to read/write data from/in a memory cell array. The sense amplifier S/A is constituted by two inverter circuits P1, N1, P2, and N2 which are flip-flop-connected. A P channel MOS transistor P3 is connected to a power supply node PN1 of the sense amplifier S/A to supply, e.g., a potential VBLH to the power supply node PN1. An N channel MOS transistor N3 is connected to a power supply node PN2 of the sense amplifier S/A to supply, e.g., a ground potential VSS to the power supply node PN2.

The sense amplifier S/A is controlled by control signals SEP and SEN. The sense amplifier S/A is activated when the control signal SEP is "L" and the control signal SEN is "H". The sense amplifier S/A is operated by the voltage VBLH. Hence, the sense amplifier S/A is constituted by only VBLH type MOS transistors and formed in the thin film type Tr area B.

The bit line equalizer BLE has a function of equalizing the potentials of the pair of bit lines BLt and BLc. The bit line equalizer BLE is constituted by N channel MOS transistors N7, N8, and N9. The N channel MOS transistor N7 has a function of short-circuiting the pair of bit lines BLt and BLc. The N channel MOS transistors N8 and N9 have a function of supplying a precharge potential VBL to the pair of bit lines BLt and BLc.

The bit line equalizer BLE is controlled by a control signal EQL. When the control signal EQL is "H", the bit line equalizer BLE equalizes the pair of bit lines BLt and BLc to the precharge potential VBL. The "H"-level voltage of the control signal EQL is a power supply voltage VCC, and the "L"-level voltage of the control signal EQL is the ground potential VSS. Hence, the bit line equalizer BLE is constituted by only VCC type MOS transistors and formed in the thick film type Tr area A.

The sense amplifier equalizer SAE has a function of equalizing the potentials of the two power supply nodes PN1 and PN2 of the sense amplifier S/A. The sense amplifier equalizer SAE is constituted by N channel MOS transistors N44, N55, and N66. The N channel MOS transistor N44 has a function of short-circuiting the two power supply nodes PN1 and PN2. The N channel MOS transistors N55 and N66 have a function of supplying the precharge potential VBL to the two power supply nodes PN1 and PN2.

The sense amplifier equalizer SAE is controlled by a control signal SAEQL. When the control signal SAEQL is "H", the sense amplifier equalizer SAE equalizes the two power supply nodes PN1 and PN2 to the precharge potential VBL.

The sense amplifier equalizer SAE is constituted by a VBLH type MOS transistor and VCC type MOS transistors.

More specifically, the N channel MOS transistor N44 as a VBLH type MOS transistor is formed in the thin film type Tr area B and laid out adjacent to, e.g., the sense amplifier S/A. The N channel MOS transistors N55 and N66 as VCC type MOS transistors are formed in the thick film type Tr area A and laid out adjacent to, e.g., the bit line equalizer BLE.

The N channel MOS transistor N44 is a VBLH type MOS transistor. Hence, the voltage VBLH is used as the "H"-level voltage of the control signal SAEQL, and the ground potential VSS is used as the "L"-level voltage of the control signal SAEQL.

Figure 11:
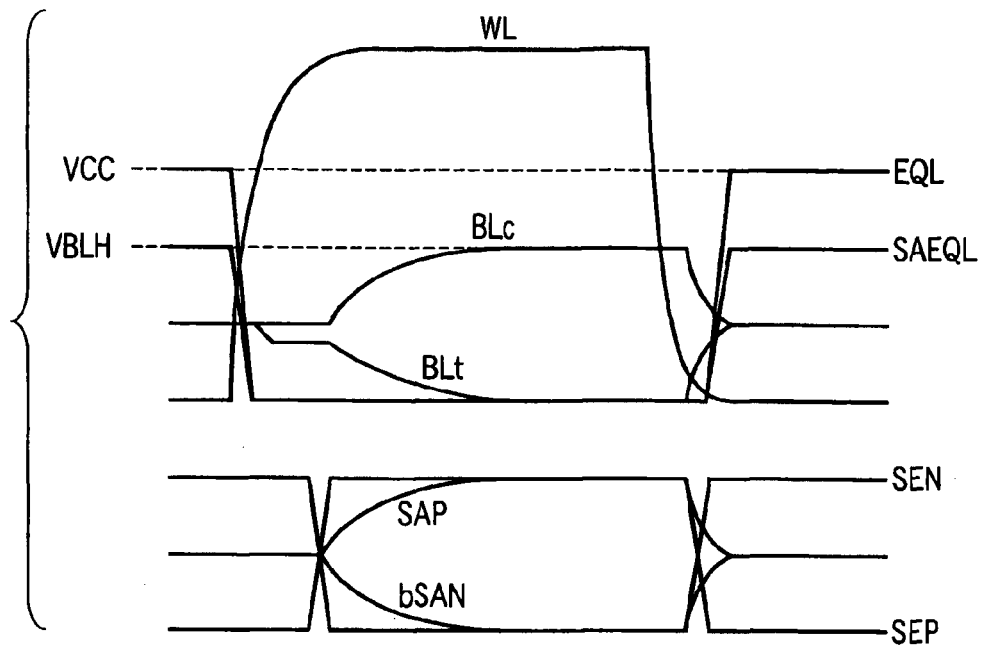
FIG. 11 is a waveform chart showing the operation of the memory cell array portion according to the first embodiment.

The operation of the memory cell array portion shown in FIGS. 8 to 10 in read operation will be described next with reference to the waveform chart shown in FIG. 11.

First, when the control signals EQL and SAEQL change to "H", the pair of bit lines BLt and BLc and the power supply nodes PN1 and PN2 of the sense amplifier S/A are equalized to the precharge potential VBL. The "H"-level voltage of the control signal EQL is VCC, and the "H"-level voltage of the control signal SAEQL is VBLH (<VCC).

Then, when the control signals EQL and SAEQL change to "L", equalization of the pair of bit lines BLt and BLc and the power supply nodes PN1 and PN2 of the sense amplifier S/A are canceled. The pair of bit lines BLt and BLc and the power supply nodes PN1 and PN2 of the sense amplifier S/A are set at the precharge potential VBL and in a floating state.

When the potential of a selected word line WL rises, a potential difference corresponding to the data of the memory cell connected to the selected word line WL is generated between the pair of bit lines BLt and BLc. When a sufficient potential difference is generated between the pair of bit lines BLt and BLc, the sense amplifier S/A is activated.

More specifically, when the control signal SEP is set to "L" and the control signal SEN is set to "H", the power supply node PN1 (SAP) changes to VBLH, i.e., "H" and the power supply node PN2 (bSAN) changes to VSS, i.e., "L", so the sense amplifier S/A is activated. As a result, the potential difference between the pair of bit lines BLt and BLc is amplified.

After that, the potential of the selected word line WL is dropped to stop the access to the memory cell. In addition, the control signal SEP is set to "H", and the control signal SEN is set to "L" to inactivate the sense amplifier S/A. Furthermore, the control signals EQL and SAEQL are set to "H" to equalize the pair of bit lines BLt and BLc and the power supply nodes PN1 and PN2 of the sense amplifier S/A.

As described above, in the first embodiment of the present invention, the sense amplifier equalizer is constituted by the plurality of MOS transistors whose gate oxide films have different thicknesses. With this structure, the problem of the increase in layout size of the memory cell array portion and the problem of the decrease in equalization speed for the sense amplifier can simultaneously be solved.

3. Second Embodiment

A semiconductor memory according to the second embodiment of the present invention will be described next.

Figure 13:
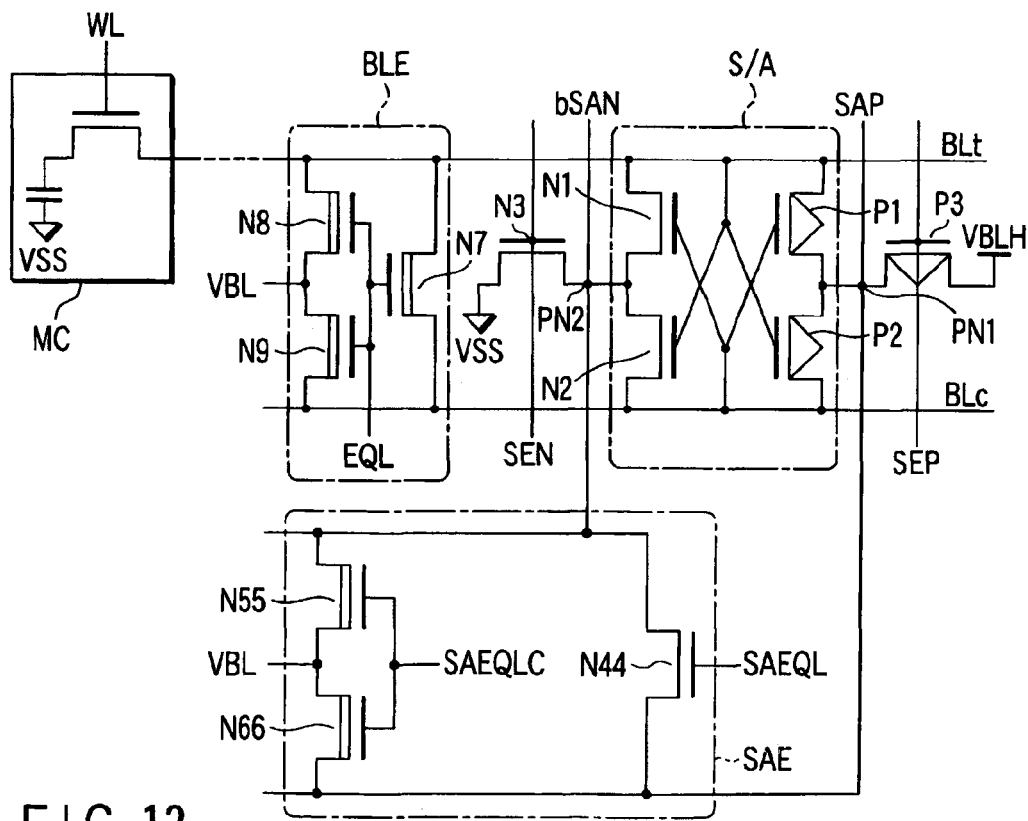
FIG. 13 is a view showing the equivalent circuit of the portion shown in FIG. 12.
Figure 12:
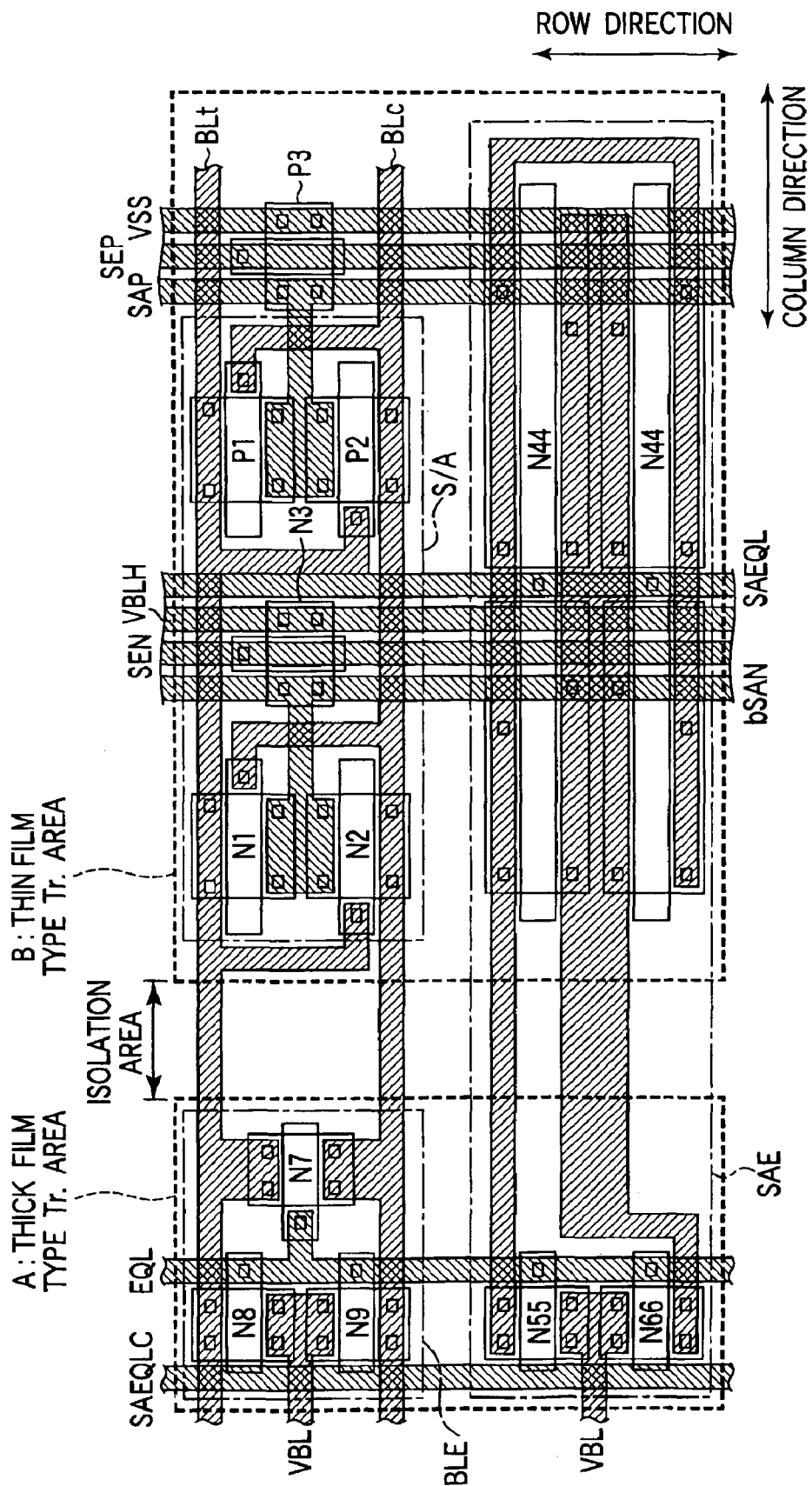
FIG. 12 is a view showing the layout of a memory cell array portion according to the second embodiment.

FIG. 12 shows the layout of the memory cell array portion of a semiconductor memory according to the second embodiment of the present invention. FIG. 13 shows an equivalent circuit of the portion shown in FIG. 12. The transistor symbols in FIG. 10 also apply to FIG. 13.

In the first embodiment (FIGS. 8 to 10), the sense amplifier equalizer SAE is constituted by the VBLH type MOS transistor N44 and VCC type MOS transistors N55 and N66, whose gate oxide films have different thicknesses. On the other hand, only VBLH-based binary data (VBLH and VSS) is used as the control signal SAEQL.

In this case, however, the VCC type MOS transistors N55 and N66 having thick gate oxide films are also controlled by the VBLH-based binary data (VBLH and VSS). That is, since the value of the "H"-level potential of the binary data is small, the VCC type MOS transistors N55 and N66 in the sense amplifier equalizer SAE cannot have a sufficient driving force.

The second embodiment proposes a technique for solving this problem. More specifically, in the second embodiment, two types of control signals (SAEQL and SAEQLC) are prepared in accordance with the types of MOS transistors that constitute a sense amplifier equalizer SAE as control signals (equalize signals) that control it.

More specifically, the control signal SAEQL controls a VBLH type MOS transistor N44. The "H"-level voltage of the control signal SAEQL is VBLH, and the "L"-level voltage is VSS. The control signal SAEQLC controls VCC type MOS transistors N55 and N66. The "H"-level voltage of the control signal SAEQLC is VCC, and the "L"-level voltage is VSS.

Accordingly, even when the sense amplifier equalizer SAE is constituted by a plurality of types of MOS transistors whose gate oxide films have different thicknesses, a sufficient driving force can be ensured.

The layout and circuit arrangement of the memory cell array portion of the second embodiment is the same as those of the first embodiment, and a description thereof will be omitted.

Figure 14:
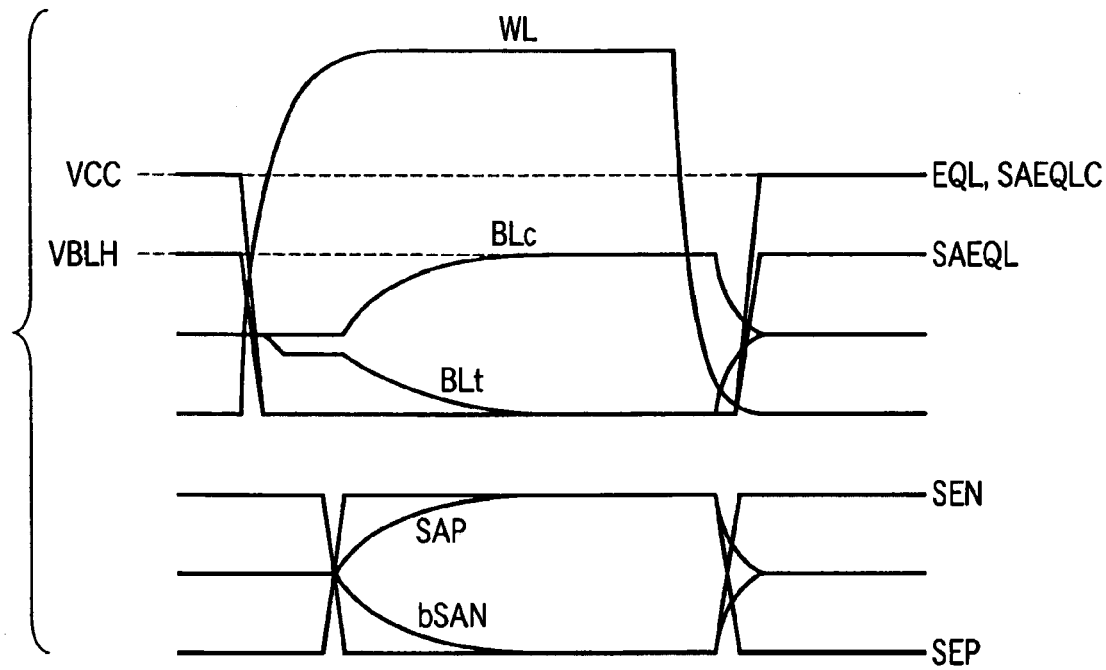
FIG. 14 is a waveform chart showing the operation of the memory cell array portion according to the second embodiment.

The operation of the memory cell array portion shown in FIGS. 12 and 13 in read operation will be described next with reference to the waveform chart shown in FIG. 14.

First, when the control signals EQL, SAEQL, and SAEQLC change to "H", a pair of bit lines BLt and BLc and power supply nodes PN1 and PN2 of a sense amplifier S/A are equalized to a precharge potential VBL. The "H"-level voltage of the control signal EQL is VCC, and the "H"-level voltage of the control signal SAEQL is VBLH (<VCC).

Then, when the control signals EQL, SAEQL, and SAEQLC change to "L", equalization of the pair of bit lines BLt and BLc and the power supply nodes PN1 and PN2 of the sense amplifier S/A is canceled. The pair of bit lines BLt and BLc and the power supply nodes PN1 and PN2 of the sense amplifier S/A are set at the precharge potential VBL and in a floating state.

When the potential of a selected word line WL rises, a potential difference corresponding to the data of the memory cell connected to the selected word line WL is generated between the pair of bit lines BLt and BLc. When a sufficient potential difference is generated between the pair of bit lines BLt and BLc, the sense amplifier S/A is activated.

More specifically, when a control signal SEP is set to "L" and a control signal SEN is set to "H", the power supply node PN1 (SAP) changes to VBLH, i.e., "H" and the power supply node PN2 (bSAN) changes to VSS, i.e., "L", so the sense amplifier S/A is activated. As a result, the potential difference between the pair of bit lines BLt and BLc is amplified.

After that, the potential of the selected word line WL is dropped to stop the access to the memory cell. In addition, the control signal SEP is set to "H", and the control signal SEN is set to "L" to inactivate the sense amplifier S/A. Furthermore, the control signals EQL, SAEQL, and SAEQLC are set to "H" to equalize the pair of bit lines BLt and BLc and the power supply nodes PN1 and PN2 of the sense amplifier S/A.

As described above, in the second embodiment of the present invention, the sense amplifier equalizer is constituted by the plurality of MOS transistors whose gate oxide films have different thicknesses. With this structure, the problem of the increase in layout size of the memory cell array portion and the problem of the decrease in equalization speed for the sense amplifier can simultaneously be solved. In addition, for the sense amplifier equalizer, a plurality of control signals are used in accordance with the types of MOS transistors that constitute the sense amplifier equalizer. Hence, the driving force does not decrease.

4. Third Embodiment

Figure 15:
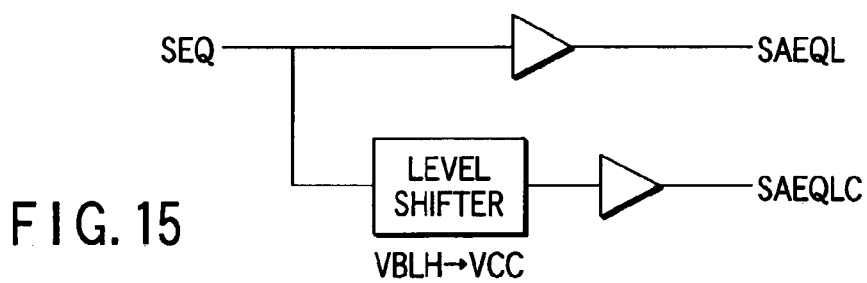
FIG. 15 is a view showing an example of a control signal generation circuit according to the third embodiment.
Figure 16:
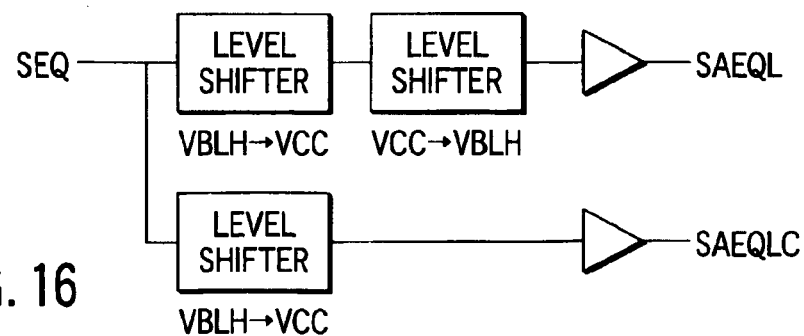
FIG. 16 is a view showing another example of the control signal generation circuit according to the third embodiment.

FIGS. 15 and 16 show control signal generation circuits of a semiconductor memory according to the third embodiment of the present invention.

The third embodiment presumes the semiconductor memory according to the second embodiment. In this semiconductor memory, the sense amplifier equalizer SAE is controlled by two types of control signals SAEQL and SAEQLC.

When the potential difference between the "H"-level voltage of the control signal SAEQL and that of the control signal SAEQLC increases, and the voltages fluctuate, the potential change timing largely shifts ("L"→"H" or "H"→"L") This timing is controlled by using level shifters.

When the change timings of the control signals SAEQL and SAEQLC are controlled using level shifters, the skew between the two control signals SAEQL and SAEQLC can be reduced even when the level of voltage VBLH or VCC fluctuates.

5. Device Structure

Figure 17:
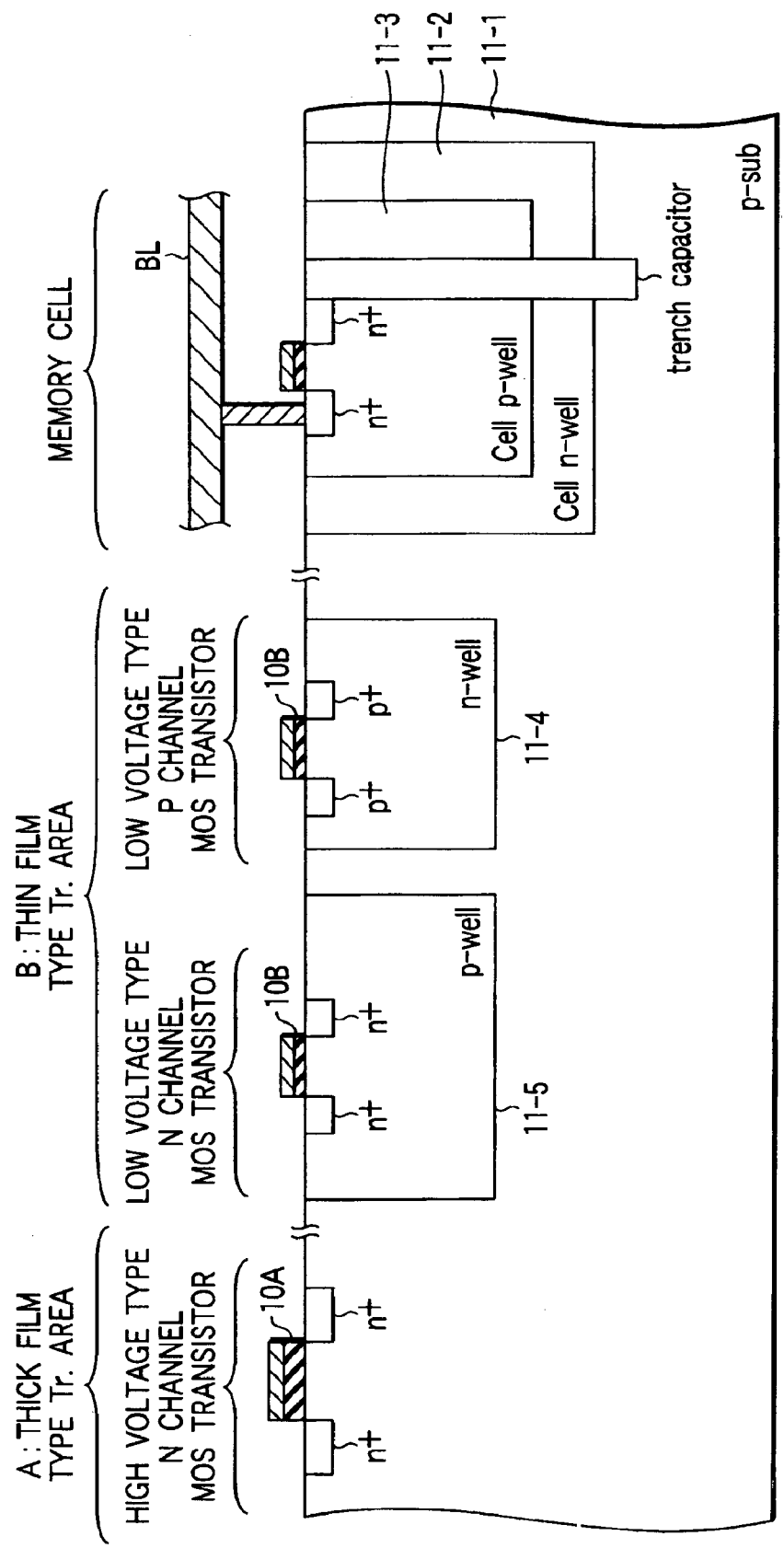
FIG. 17 is a view showing an example of the device structure of the memory cell array portion according to each embodiment.

FIG. 17 shows the schematic device structure of the memory cell array portion according to each of the first to third embodiments.

In this example, a memory cell of the trench capacitor type is employed. However, a memory cell of any other type, such as a stack capacitor type, may be used. As shown in FIG. 17, a gate oxide film 10A of a high voltage type N channel MOS transistor formed in a thick film type Tr area A is thicker than a gate oxide film 10B of a low voltage type N channel MOS transistor or low voltage type P channel MOS transistor formed in a thin film type Tr area B.

As has been described above, according to the present embodiments described above, even when the gate oxide film of each transistor that constitutes a sense amplifier has a thickness different from that of the gate oxide film of each transistor that constitutes a bit line equalizer, any increase in layout size of a memory cell array portion can be prevented, and any decrease in driving force of a sense amplifier equalizer can be suppressed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory comprising:
a memory cell array having a memory cell;
a sense amplifier to read/write data from/in the memory cell array;
a pair of bit lines to connect the memory cell to the sense amplifier;
a bit line equalizer to equalize potentials of the pair of bit lines; and
a sense amplifier equalizer to equalize potentials of two power supply nodes of the sense amplifier,
wherein the sense amplifier equalizer comprises MOS transistors whose gate oxide films have different thicknesses; and
wherein the MOS transistors comprises,
a thin film type transistor which short-circuits the two power supply nodes, and
a thick film type transistor which has a gate oxide film thicker than that of the thin film type transistor and applies a precharge potential to the two power supply nodes.

2. The memory according to claim 1, wherein the sense amplifier equalizer is controlled by control signals having different logic amplitudes in correspondence with the MOS transistors.

3. The memory according to claim 2, wherein the control signals are generated on the basis of one input signal.

4. The memory according to claim 3, wherein at least one of the control signals is generated by level shifters.

5. The memory according to claim 1, wherein the thin film type transistor is adjacent to the sense amplifier, and the thick film type transistor is adjacent to the bit line equalizer.

6. The memory according to claim 5, wherein isolation areas are arranged respectively between the thin film type transistor and the thick film type transistor and between the sense amplifier and the bit line equalizer.

7. The memory according to claim 6, wherein
the sense amplifier comprises a thin film type transistor, and
the bit line equalizer comprises a thick film type transistor which has a gate oxide film thicker than that of the thin film type transistor.

8. A semiconductor memory comprising:
a memory cell array comprising memory cells arranged in a matrix;
sense amplifiers to read/write data from/in the memory cell array;
pairs of bit lines to connect the memory cells to the sense amplifiers;
bit line equalizers to equalize potentials of the pairs of bit lines; and
a sense amplifier equalizer to equalize potentials of two power supply nodes for at least one of the sense amplifiers,
wherein the sense amplifier equalizer comprises MOS transistors whose gate oxide films have different thicknesses; and
wherein the MOS transistors comprises,
a thin film type transistor which short-circuits the two power supply nodes, and
a thick film type transistor which has a gate oxide film thicker than that of the thin film type transistor and applies a precharge potential to the two power supply nodes.

9. The memory according to claim 8, wherein the sense amplifier equalizer is arranged between the sense amplifiers.

10. The memory according to claim 8, wherein the sense amplifier equalizer is controlled by control signals having different logic amplitudes in correspondence with the MOS transistors.

11. The memory according to claim 10, wherein the control signals are generated on the basis of one input signal.

12. The memory according to claim 11, wherein at least one of the control signals is generated by level shifters.

13. The memory according to claim 8, wherein the thin film type transistor is adjacent to one of the sense amplifiers, and the thick film type transistor is adjacent to one of the bit line equalizers.

14. The memory according to claim 13, wherein isolation areas are arranged respectively between the thin film type transistor and the thick film type transistor and between the sense amplifiers and the bit line equalizers.

15. The memory according to claim 14, wherein each of the sense amplifiers comprises a thin film type transistor, and each of the bit line equalizers comprises a thick film type transistor which has a gate oxide film thicker than that of the thin film type transistor.

* * * * *